(12) United States Patent
Terry et al.

(10) Patent No.: US 7,923,368 B2
(45) Date of Patent: Apr. 12, 2011

(54) JUNCTION FORMATION ON WAFER SUBSTRATES USING GROUP IV NANOPARTICLES

(75) Inventors: Mason Terry, Redwood City, CA (US); Homer Antoniadis, Mountain View, CA (US); Dmitry Poplavskyy, San Jose, CA (US); Maxim Kelman, Mountain View, CA (US)

(73) Assignee: Innovalight, Inc., Sunnyvale, CA (US)

( * ) Notice: Subject to any disclaimer, the term of this patent is extended or adjusted under 35 U.S.C. 154(b) by 258 days.

(21) Appl. No.: 12/109,684

(22) Filed: Apr. 25, 2008

(65) Prior Publication Data

US 2009/0269913 A1 Oct. 29, 2009

(51) Int. Cl.
*H01L 21/44* (2006.01)
(52) U.S. Cl. ........ 438/660; 438/603; 438/604; 438/657; 257/E21.135; 257/E21.466
(58) Field of Classification Search ............... 438/657, 438/660, 603, 604; 257/E21.135, E21.466
See application file for complete search history.

(56) References Cited

U.S. PATENT DOCUMENTS

| | | | |
|---|---|---|---|
| 5,720,827 A | 2/1998 | Simmons | |
| 5,766,971 A | 6/1998 | Ahlgren et al. | |
| 6,126,740 A | 10/2000 | Schulz et al. | |
| 6,239,355 B1 | 5/2001 | Salafsky | |
| 6,268,014 B1 | 7/2001 | Eberspacher et al. | |
| 6,277,766 B1 | 8/2001 | Ayers | |
| 6,358,613 B1 | 3/2002 | Buriak | |
| 6,485,986 B1 | 11/2002 | Buriak et al. | |
| 6,569,979 B1 | 5/2003 | Strother et al. | |
| 6,677,163 B1 | 1/2004 | Boukherroub et al. | |
| 6,710,366 B1 | 3/2004 | Lee et al. | |
| 6,846,681 B2 | 1/2005 | Buriak et al. | |
| 6,869,864 B2 | 3/2005 | Yim et al. | |
| 6,878,871 B2 | 4/2005 | Scher et al. | |
| 6,897,471 B1 | 5/2005 | Soref et al. | |
| 6,943,054 B2 | 9/2005 | Bocian et al. | |
| 6,986,818 B2 | 1/2006 | Tillotson et al. | |
| 2002/0098653 A1* | 7/2002 | Flagan et al. | ................. 438/260 |
| 2004/0095658 A1 | 5/2004 | Buretea et al. | |

(Continued)

FOREIGN PATENT DOCUMENTS

DE 103 26 538 A1 1/2005

(Continued)

OTHER PUBLICATIONS

International Search Report and Written Opinion for PCT/US2009/040069 mailed Jan. 5, 2010.

(Continued)

*Primary Examiner* — Michelle Estrada
(74) *Attorney, Agent, or Firm* — Foley & Lardner LLP

(57) ABSTRACT

A method of forming a diffusion region is disclosed. The method includes depositing a nanoparticle ink on a surface of a wafer to form a non-densified thin film, the nanoparticle ink having set of nanoparticles, wherein at least some nanoparticles of the set of nanoparticles include dopant atoms therein. The method also includes heating the non-densified thin film to a first temperature and for a first time period to remove a solvent from the deposited nanoparticle ink; and heating the non-densified thin film to a second temperature and for a second time period to form a densified thin film, wherein at least some of the dopant atoms diffuse into the wafer to form the diffusion region.

3 Claims, 6 Drawing Sheets

U.S. PATENT DOCUMENTS

| | | | |
|---|---|---|---|
| 2004/0166306 A1* | 8/2004 | Black et al. | 428/325 |
| 2004/0229447 A1 | 11/2004 | Swihart et al. | |
| 2004/0266148 A1 | 12/2004 | Yim et al. | |
| 2005/0008880 A1 | 1/2005 | Kunze et al. | |
| 2005/0012095 A1 | 1/2005 | Niira et al. | |
| 2005/0078158 A1 | 4/2005 | Magdassi et al. | |
| 2005/0107478 A1 | 5/2005 | Klimov et al. | |
| 2005/0126628 A1 | 6/2005 | Scher et al. | |
| 2005/0150541 A1 | 7/2005 | Scher et al. | |
| 2005/0183766 A1 | 8/2005 | Nakajima et al. | |
| 2005/0214967 A1 | 9/2005 | Scher et al. | |
| 2006/0060862 A1 | 3/2006 | Bawendi et al. | |
| 2006/0094189 A1 | 5/2006 | Zurcher et al. | |
| 2006/0108688 A1 | 5/2006 | Richardson et al. | |
| 2006/0284171 A1* | 12/2006 | Levy et al. | 257/43 |
| 2006/0292836 A1 | 12/2006 | Peng | |
| 2007/0006914 A1 | 1/2007 | Lee | |
| 2008/0138966 A1* | 6/2008 | Rogojina et al. | 438/502 |
| 2008/0160265 A1 | 7/2008 | Hieslmair et al. | |
| 2008/0160733 A1 | 7/2008 | Hieslmair et al. | |
| 2008/0230782 A1* | 9/2008 | Antoniadis et al. | 257/53 |
| 2009/0053878 A1* | 2/2009 | Kelman et al. | 438/509 |

FOREIGN PATENT DOCUMENTS

| | | |
|---|---|---|
| EP | 0654831 | 5/1995 |
| JP | 2002-299274 | 10/2002 |
| JP | 2003 188393 | 7/2003 |
| JP | 2003-218048 | 7/2003 |
| JP | 2004-071716 | 3/2004 |
| JP | 2004 221149 | 8/2004 |
| JP | 2005-217046 | 8/2005 |
| JP | 2005332913 A | 12/2005 |
| WO | WO 99/21934 | 5/1999 |
| WO | WO 01/37324 | 5/2001 |
| WO | WO 02/084708 | 10/2002 |
| WO | WO 2004/023527 | 3/2004 |
| WO | WO 2004/068536 | 8/2004 |
| WO | WO 2004/093202 | 10/2004 |
| WO | WO 2005/075048 | 8/2005 |
| WO | WO 2006/034025 | 3/2006 |
| WO | WO 2006/063893 | 6/2006 |
| WO | WO 2006/076610 | 7/2006 |
| WO | WO 2008/039757 | 4/2008 |

OTHER PUBLICATIONS

International Search Report and Written Opinion for PCT/US2008/061611 dated Jan. 21, 2009.

Goldstein, A. N., "The melting of silicon nanocrystal: Submicron thin-film structures derived from nanocrystal precursors," *Applied Physics A: Materials Science & Processing*, Springer International, DE, vol. 62, Jan. 1996, pp. 33-37.

Miyake, M., "Shallow Boron-Doped Layer Formation by Boron Diffusion from Poly-Si Through Thin $SiO_2$," *Journal of the Electrochemical Society*, Hooksett, New Hampshire, vol. 141, No. 6, Jun. 1994, pp. 1702-1708.

Pfiester, J. R. et al., "An Ultra-Shallow Buried-Channel PMOST Using Boron Penetration," IEEE *Transactions on Electron Devices*, IEEE Service Center, Piscataway, New Jersey, vol. 40, No. 1, Jan. 1993, pp. 207-212.

Garcia-Serrano, J. et al., "Formation and vibrational structure of Si nano-clusters in ZnO matrix," *Revista Mexicana De Fisica*, 47(1), Feb. 2001, pp. 26-29.

Ray, S. K. et al., "Luminescence characteristics of Ge nanocrystals embedded in $SiO_2$ matrix," *Optical Materials*, 27, Feb. 2005, pp. 948-952; published by Elsevier B.V.

Ando, M. et al., "Transient photocurrent of (silicon nanocrystals)-(organic polysilane) composites—detection of surface states of silicon nanocrystals," *Thin Solid Films*, 499 (1-2), Mar. 2006, pp. 119-122; published by Elsevier B.V.

Martucci, A. et al., "Microstructural and nonlinear optical properties of silica-titania sol-gel film doped with PbS quantum dots," *J. Applied Physics*, 86 (1), Jul. 1999, pp. 79-87; published by American Institute of Physics.

Guglielmi, M. et al., "Control of Semiconductor Particle Size in Sol-Gel Thin Films," *Journal of Sol-Gel Sciences and Technology*, 8, 1997, pp. 1017-1021; published by Kluwer Academic Publishers, The Netherlands.

Buriak, J. M., "Organometallic chemistry on Silicon and Germanium Surfaces," *Chemical Reviews*, 102 (5) (May 2002), pp. 1271-1308; published by American Chemical Society.

Lau, H. W. et al., "Defect-induced photoluminescence from tetraethylorthosilicate thin films containing mechanically milled silicon nanocrystals," *J. Applied Physics*, 97 (10) (May 2005), pp. 104307-1-104307-4; published by American Institute of Physics.

Dias, M. L. et al., "Core shell silica-silicon hybrid nanoparticles: synthesis and characterization," *J. Metastable and Nanocrystalline Materials*, 22 (2004), pp. 83-90; published by Trans Tech Publications, Switzerland.

International Search Report for PCT/US2007/067126, mailed Dec. 5, 2007.

International Search Report for PCT/US2007/073037, mailed Nov. 15, 2007.

Dang, Y. X. et al., "Study of the Interdiffusion Effect on the Band Structures of $Si_{1-x}Ge_x$/Si Quantum Wells," *Journal of Applied Physics*, vol. 99, No. 7, Apr. 10, 2006, pp. 076108-1-076108-3; published by American Institute of Physics.

Lenhart, J. L. et al., "Characterization of sizing layers and buried polymer/sizing/substrate interfacial regions using a localized fluorescent probe," *Journal of Colloid and Interface Science*, vol. 257 (2003), pp. 398-407; published by Elsevier Science (USA).

Li-Wei Tu et al., "Observation of quantum size effect in the resistivity of thin, gray tin epilayers", *Appl. Phys. Lett.*, vol. 55, No. 13, Sep. 25, 1989, pp. 1327-1329; published by American Institute of Physics.

Miesner, C. et al., "Intra-Valence Band Photocurrent Measurements on Ge Quantum Dots in Si," *Thin Solid Films*, vol. 380, No. 1-2, Dec. 22, 2000, pp. 180-182; published by Elsevier Science B.V.

Samey, W. L. et al., "Microstructural Characterization of Quantum Dots with Type-II Band Alignments," *Solid-State Electronics*, vol. 50, No. 6, Jun. 2006, pp. 1124-1127; published by Elsevier Ltd.

Nozik, A. J., "Advanced Concepts for Photovoltaic Cells," Presented at the National Center for Photovoltaics and Solar Program Review Meeting: Denver, Colorado, Mar. 24-26, 2003, pp. 1-5.

Ellingson et al. "Highly Efficient Multiple Exciton Generation in Colloidal PbSe and PbS Quantum Dots," *Nano Letters*, vol. 5, No. 5, (2005) pp. 865-871; published by American Chemical Society.

Ellingson et al. "Nanocrystals Generating >1 Electron Per Photon May Lead to Increased Solar Cell Efficiency," Printed from website on Sep. 11, 2006: http://newsroom.spie.org/x3923.xml?ss=print.

Shang Yuan Ren, "Quantum Confinement in Semiconductor Ge Quantum Dots," *Solid State Communications*, vol. 102, No. 6 (1997) pp. 479-484; published by Elsevier Science Ltd.

Wenju Feng et al., "Self-Assembly and Characterization of Fullerene Monolayers on Si(100) Surfaces," *Langmuir American Chem. Soc. USA*, vol. 15, No. 9 (Apr. 27, 1999), pp. 3152-3156; published by American Chemical Society.

Chekalin, S. et al., "Ultrafast photoinduced processes in fullerene-metal nanostructures," *Proc. Spie. Int. Eng; Proceedings of Spie—The International Society for Optical Engineering; Photon Echo and Coherent Spectroscopy*, vol. 6181 (2005), Sep. 18, 2005, pp. 1-5.

Database WPI Week 200564, Derwent Publications Ltd., London, GB, reporting Abstract of JP2005-236278.

Mayo, M. J. et al., "Porosity-Grain Growth Relationships in the Sintering of Nanocrystalline Ceramics," *Nanostructured Materials*, vol. 3, pp. 43-52, 1993; published by Pergamon Press Ltd.

International Search Report for PCT/US2007/077007, mailed Mar. 17, 2008.

International Search Report for PCT/US2007/079393, mailed Sep. 25, 2008.

International Search Report for PCT/US2007/084655, mailed Oct. 8, 2008.

\* cited by examiner

JUNCTION FORMATION ON WAFER SUBSTRATES USING GROUP IV NANOPARTICLES

FIELD OF DISCLOSURE

This disclosure relates in general to nanoparticles, and in particular Group IV nanoparticle junctions and devices therefrom.

BACKGROUND

Semiconductors form the basis of modern electronics. Possessing physical properties that can be selectively modified and controlled between conduction and insulation, semiconductors are essential in most modern electrical devices (e.g., computers, cellular phones, photovoltaic cells, etc.). Group IV semiconductors generally refer to those elements in the fourth column of the periodic table (e.g., carbon, silicon, germanium, etc.).

In general, a solid semiconductor tends to exist in three forms: crystalline, polycrystalline, and amorphous. In crystalline form, semiconductor atoms are positioned in a single unbroken crystal lattice with no grain boundaries. In polycrystalline form, the semiconductor atoms are positioned in many smaller and randomly oriented crystallites (smaller crystals). The crystallites are often referred to as grains. In amorphous form, the semiconductor atoms show no long-range positional order.

In general, conduction generally refers to the movement of electrically charged carriers, such as electrons or holes (i.e., lack of electrons), through electromagnetic fields. Metals tend to have substantial amounts of electrically charged particles available, whereas insulators have very few.

In the absence of impurities (called dopants), a semiconductor tends to behave as insulator, inhibiting the flow of an electric current. However, after the addition of relatively small amounts of dopants, the electrical characteristics of a semiconductor can dramatically change to a conductor by increasing the amount of electrically charged carriers. For example, in a process called photoexcitation, absorbed light will generally create an electron-hole pair (photocarriers) that in turn tends to increase overall conductivity (photoconductivity).

Depending on the kind of impurity, a doped region of a semiconductor can have more electrons (n-type) or more holes (p-type). For example, in a common configuration, a p-type region is placed next to an n-type region in order to create a (p-n) junction with a "built-in" potential. That is, the energy difference between the two Fermi levels.

Under generally accepted principles of quantum mechanics, electrons of an atom can only reside in certain states, so that only particular energy levels are possible. However, the occupation of particular energy states cannot be determined with particularity. Consequently, for an ensemble of atoms (e.g., solid) a probability distribution or density is commonly used, called the Fermi level. In general, the Fermi level describes the energy level at given temperature in which ½ of the energy states are filled. Energy states are unique and correspond to a quantum number.

Consequently, electrons on the p-type side of the junction within the electric field may then be attracted to the n-type region and repelled from the p-type region, whereas holes within the electric field on the n-type side of the junction may then be attracted to the p-type region and repelled from the n-type region. Generally, the n-type region and/or the p-type region can each respectively be comprised of varying levels of relative dopant concentration, often shown as n−, n+, n++, p−, p+, p++, etc. The built-in potential and thus magnitude of electric field generally depend on the level of doping between two adjacent layers.

There are several methods of doping a semiconductor. One method involves depositing a doped glass on a semiconductor substrate, such as a Si wafer. Once exposed to relatively high temperature (e.g., 800-1100° C.), the dopants will tend to diffuse from the highly-doped glass into the substrate.

In addition, the high temperature also tends to anneal the substrate. Annealing is generally the process of heating a material above a certain critical temperature in order to reduce the materials internal stresses, and or improve its physical and electrical properties. In the case of a semiconductor substrate, annealing allows the dopant atoms to properly diffuse (from a high to a lower concentration region) and position themselves in the lattice, such that the additional electrons or holes (which arise from the n-type and p-type dopants, respectively) are available for the transmission of current. This is generally called activation (or effectiveness of "donation") and is critical for the creation of an efficient p-n junction.

There are several methods of doping a semiconductor. However, most of these may be problematic. For example, a common method involves depositing a doped glass on a semiconductor substrate via a silk-screen. A printing technique that makes use of a squeegee, silk-screening mechanically forces a liquid, such as a highly doped glass paste, directly onto a substrate. After drying the liquid the wafer is placed in a conveyor belt passing through the furnace. The temperature inside it can be adjusted in several zones and, though the furnace is open, gases can be supplied. A cycle begins with several minutes at around 600° C. with clean air to burn off the organic materials of the paste, followed by the diffusion step at relatively high temperatures (e.g., 800-1100° C.), where the dopants tend to diffuse from the highly-doped glass into the substrate. The high temperature will also tend to anneal the substrate.

However, the downward mechanical force of the squeegee also tends to subject the substrate to stress, and hence may detrimentally affect the electrical and physical characteristics of the substrate. For devices that required multiple deposition steps, such as a back contact solar cell, the stress is aggravated. In general, every additional screen printing step tends to reduce the process yield (and increase costs) due to damage or breakage. Additionally, alignment of the screen pattern may also present substantial challenges. For example, if pattern alignment is poor, the resulting solar cells may malfunction (short) further reducing process yield.

In an alternate doping method, dopants may be deposited in a crystalline or polycrystalline substrate through ion implantation. Ion implantation generally accelerates dopant ions into the substrate at high energy. Like diffusion doping, the substrate must also generally be annealed at a high temperature to repair the substrate and activate the dopants. However, although dopant dosage may be controlled with high precision, ion implantation tends to be very expensive since it requires the use of specialized and expensive semiconductor manufacturing equipment.

Likewise, the use of chemical vapor deposition (CVD) to add dopants may also have drawbacks. In a typical CVD process, a substrate (which can be an insulator, a semiconductor, or metal) is exposed to one or more volatile precursors, which react and/or decompose on the substrate surface to produce a doped film. However, like ion implantation, CVD is expensive since it requires specialized and expensive semiconductor manufacturing equipment. In addition, CVD also tends to be very slow, as the film layers are built up a single atom at a time.

Other common doping techniques include gas phase doping. In these the cells to be diffused, loaded in quartz boats, are placed in a quartz tube with resistance heating and held at the processing temperature. The cells enter and exit the furnace through one end, while gases are fed through the opposite one. Dopant itself can be supplied in this way, typically by bubbling nitrogen through liquid dopant precursor before injection into the furnace. Solid dopant sources are also compatible with furnace processing. Five to fifteen minutes at temperatures in the range from about 900° C. to about 950° C. can be considered representative. These methods however suffer from lack of ability to pattern simultaneous p-type and n-type doping. In addition this process does not comply with requirements of in-line processing and may have limited manufacturing throughput.

In view of the foregoing, there is desired a method of producing Group IV nanoparticle junctions and devices therefrom.

SUMMARY

The invention relates, in one embodiment, to a method of forming a diffusion region. The method includes depositing a nanoparticle ink on a surface of a wafer to form a non-densified thin film, the nanoparticle ink having set of nanoparticles, wherein at least some nanoparticles of the set of nanoparticles include dopant atoms therein. The method also includes heating the non-densified thin film to a first temperature and for a first time period to remove a solvent from the deposited nanoparticle ink; and heating the non-densified thin film to a second temperature and for a second time period to form a densified thin film, wherein at least some of the dopant atoms diffuse into the wafer to form the diffusion region.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

Figure 1A:
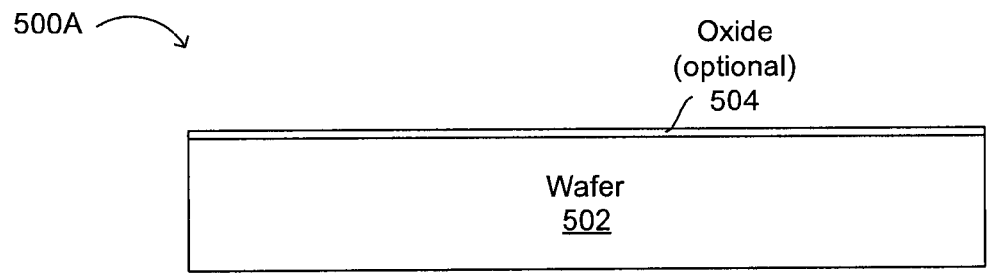
FIGS. 1A-D show a simplified set of cross-section diagrams of an example process flow for doping a wafer through an option oxide layer, in accordance with the present invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

As previously described, current methods of forming junctions tend to be costly, difficult to pattern, damaging to the substrate and/or limiting high throughput manufacturing. In an advantageous manner, a set of Group IV nanoparticle layers may be created such that an efficient junction (e.g., p-n, metal-silicon, etc.) may be formed at a lower cost, with easier patternability, and causing less damage to the substrate than with alternate methods.

A typical solar cell generally comprises at least two elements. First, an absorber region (typically a semiconductor) is configured to generate charge carriers (electrons and holes) by the absorption of light. And second, a set of junctions is configured to separate the charge carriers (in the case of a p-n junction), as well as to channel the charge carriers out of the solar cell (in the case of a metal-semiconductor junction).

A free charge carrier is generally created only when an incoming photon has sufficient energy to free the carrier from its atom and the carrier thus conducts electricity. That is, for an electron to move from a valence energy band (valence band) to the conduction energy band (conduction band). In the valence band electrons are bound to the host atom. In contrast, in the conduction band, electrons (and their corresponding holes in the valence band) are free and have sufficient energy to function as free charge carriers. Between the valence band and the conduction band is generally a range of energies that cannot be occupied by an electron, called the band gap.

If the band gap is large (~>5.0 eV), the material is an insulator. If the band gap small or non-existent (~0.0 eV), the material is a metal. However, if the band gap is somewhere in the middle, then the material may function as a semiconductor. For example, Si has a band gap of about 1.12 eV.

As previously described, the Fermi level describes the energy level at a given temperature in which ½ of the energy states are filled. The addition of relatively small amounts of dopants to a semiconductor, such as Group III or Group V elements to a Group IV semiconductor, can increase the amount of electrically charged carriers. If an n-type dopant is added [e.g., P (phosphorus), As (arsenic), Sb (antimony), etc.] the Fermi level is increased to a position closer to the conduction band. Likewise, when a p-type dopant is added [e.g., B (boron), Ga (gallium), In (indium), etc.), the Fermi level is decreased to a position closer to the valence band.

In general, when a p-type region is placed next to an n-type region, a p-n junction is created. Consequently, as the Fermi levels of each region equilibrate, an electric field (or a built-in potential) tends to form as a result of charge redistribution across the junction. Electrons created on the p-type region (electron minority carriers) within the electric field may then be attracted to the n-type region and repelled from the p-type region, whereas holes created (hole minority carriers) on the n-type region within the electric field may then be attracted to the p-type region and repelled from the n-type region. These minority carriers may then be channeled out of the solar cell to create electricity.

As electron-hole pairs are generated, each is available to diffuse through the lattice until it comes under the influence of an electric field near an n-type region or p-type region respectively and eventually being extracted by the contacts in the external circuit. However, imperfections within the p-type region (collector), n-type region (emitter), the absorber, or at their interface, can create charge traps by destroying minority carriers.

Breaks in the lattice structure, the existence of interstitial atoms (within the crystal structure but not at a lattice site), or contaminants (e.g., oxygen, oxygen complexes, metal impurities, etc.), may create intermediate energy states in the band gap, below the conduction band. Consequently, the minority carriers recombine with the oppositely charged majority carriers, instead of being channeled out of the solar cell, and thus are unavailable to generate electricity.

A crystal lattice structure (e.g., Si wafer, etc.) is thus preferred as absorbers to minimize recombination in photovoltaic applications. For example, a Si wafer (absorber) may be first created as n-type or p-type, and then infused on one side using an appropriate technique (e.g., through chemical vapor deposition, ion implantation, gas-phase diffusion, spray-on diffusion, spin-on diffusion, doped glass, etc.) with the opposite dopant, n-type (n+) or p-type (p+) respectively, in order to create a p-n junction. However, this diffusion process tends to be expensive and inflexible to patterning.

Furthermore, as previously stated, depositing doped glass may be problematic. For example, doped glass is often applied via a silk-screen. Silk-screening is generally a printing technique that makes use of a squeegee to mechanically force a liquid, such as a highly doped glass paste, directly onto a substrate. Consequently, this downward mechanical force tends to subject the substrate to additional stresses, and hence may detrimentally affect the electrical and physically characteristics of the substrate.

In addition, creating alternating n-type and p-type regions on the same side of the substrate with a doped glass, such as with back contact solar cells, requires multiple screen printing steps. In general, every additional screen printing step may reduce the process yield due to damage or breakage during printing or handling. Wafer breakage can also cause production line downtime, further increasing costs. Furthermore as the thickness of the Si wafer reduces these yield losses are expected to increase.

Aligning a subsequent screen pattern to existing patterns on the substrate also presents substantial challenges. For example, if pattern alignment is poor, the resulting solar cells may malfunction (short) further reducing process yield.

In an advantageous manner, multiple regions of varying dopant concentrations may be used to optimize boundary efficiency and carrier diffusion length.

Characteristics of Group IV Nanoparticles and Colloidal Dispersions

In general, a nanoparticle is a microscopic particle with at least one dimension less than 100 nm. The term "Group IV nanoparticle" generally refers to hydrogen terminated Group IV nanoparticles having an average diameter between about 1 nm to 100 nm, and composed of silicon, germanium, carbon, or combinations thereof. The term "Group IV nanoparticle" also includes Group IV nanoparticles that are doped.

In comparison to a bulk material (>100 nm) which tends to have constant physical properties regardless of its size (e.g., melting temperature, boiling temperature, density, conductivity, etc.), nanoparticles may have physical properties that are size dependent, and hence useful for applications such as junctions. For example, semiconductor nanoparticles may be more easily and cheaply patterned into forming p-n junctions when compared to alternate methods, such as silk-screening or deposition.

In general, semiconductor nanoparticles typically must be formed into dense connected regions in order to create a junction. One such method is sintering. Generally a method for making particles adhere to each other, interacting nanocrystals sinter before size-dependent melting occurs. A. N. Goldstein, *The melting of silicon nanocrystals: Submicron thin-film structures derived from nanocrystal precursors*, APPLIED PHYSICS A., 1996. Consequently, Group IV nanoparticles that are substantially spherical and preferably between about 4 nm and about 100 nm in diameter tend to sinter at lower temperatures, and hence are beneficial to create junctions. In yet another configuration, the Group IV nanoparticles are substantially spherical and more preferably between about 4.0 nm and about 20.0 nm in diameter. In yet another configuration, the Group IV nanoparticles are substantially spherical and most preferably 7.0 nm.

For example, below about 13 nm, the sintering temperature of a Si nanoparticle sharply decreases with corresponding decrease in nanoparticles diameter. Above about 13 nm, it is believed that the sintering temperature gradually increases with a corresponding increase in diameter size, eventually reaching about 947° C., or 67% of the melting temperature of Si (about 1414° C.). The relationship equation is:

$$T_S = T_0\left(1 - \frac{\beta}{d}\right)$$

Where $T_S$ is the nanoparticles sintering temperature, $T_0$ is the sintering temperature of Si, $\beta$ is a constant related to the atomic spacing (approximately 1.88 for Si), and d is the diameter of the nanoparticle. For a given nanoparticle material, smaller nanoparticles generally have a lower sintering temperature than that of larger nanoparticles.

In general, various heat sources may be used to sinter the nanoparticle, such as conventional contact thermal sources (e.g., resistive heaters, etc.), as well as radiative heat sources (e.g., lamps, lasers, microwave processing equipment, plasmas, tungsten-halogen, continuous arc lamps, flash lamps, etc.). In the case of lasers, a wavelength range of between about 0.3 microns and about 10 microns is generally optimal.

Furthermore, smaller particles may be more readily suspended in a colloidal dispersion. Because of their small size, nanoparticles tend to be difficult to manipulate. Consequently, in an advantageous manner, assembled nanoparticles may be suspended in a colloidal dispersion or colloid, such as an ink, in order to transport and store the nanoparticles.

Examples of solvents include alcohols, aldehydes, ketones, carboxylic acids, esters, amines, organosiloxanes, halogenated hydrocarbons, and other hydrocarbon solvents. In addition, the solvents may be mixed in order to optimize physical characteristics such as viscosity, density, polarity, etc.

In addition, in order to better disperse the Group IV nanoparticles in the colloidal dispersion, nanoparticle capping groups may be formed with the addition of organic compounds, such as alcohols, aldehydes, ketones, carboxylic acids, esters, and amines, as well as organosiloxanes. Alternatively, capping groups may be added in-situ by the addition of gases into the plasma chamber. These capping groups may be subsequently removed during the sintering process, or in a lower temperature pre-heat just before the sintering process.

Once formulated, the colloidal dispersion may be applied to a substrate and subjected to a heat treatment in order to sinter the Group IV nanoparticles into a densified conductive film. Examples of application methods include, but are not limited to, roll coating, slot die coating, gravure printing, flexographic drum printing, and inkjet printing methods, etc. More details may be found in U.S. Patent App. No. 60/969, 887 (hereafter '887), filed Sep. 4, 2007, the entirety of which is incorporated herein by reference.

P-N Junction Formation on a Wafer via Dopant Diffusion From Group IV Nanoparticle Layer During Annealing/Sintering In general, creating a junction (such as an emitter) on a wafer or other supporting substrate (e.g., glass, foil, etc.) or on a thin film device, or creating a diffused region on a wafer (e.g., diffused back surface field (BSF), contact region, etc.) can utilize various diffusion processes, such as those involving tube furnace solid sources, spin-on dopants, diffusion from liquids, or gas phase diffusion. However, such processes typically involve lengthy high temperature process steps, e.g., in a tube or diffusion furnace. Other problems with these approaches include thermal stress, creation of thermal donors, and diffusion of contaminates. Additionally, when forming the p-n junction in a diffusion process on the front of the wafer, the rear side will also experience diffusion of the dopant.

As such, additional masking steps are usually performed prior to the diffusion process in order to provide a suitable diffusion barrier, a BSF is applied after the diffusion process to compensate the parasitic dopants on the wafer back (e.g., by repelling minority carriers), or a dry etch process may be applied to the edges of the wafer. Thus, an additional step (e.g., masking and/or processing in a diffusion furnace), as well as relative difficulty in creating patterns by using traditional semiconductor techniques (e.g., masking, etc.), results in increased manufacturing costs. However, printing of nanoparticle ink as described herein can be used for a more cost effective junction creation approach.

In certain configurations, a highly doped nanoparticle (e.g., nano-silicon) ink is applied to a wafer surface. For example, the highly doped nanoparticle ink may be about two orders of magnitude higher in doping concentration than that of the wafer. During sintering (e.g., using thermal, rapid thermal, flash lamp, laser annealing, etc.) of the deposited ink, a densified ink film formed therefrom can provide a dopant source for the wafer. In this fashion, dopant species can diffuse out of the sintered deposited ink film, and into the wafer bulk. Further, in forming a p-n junction in particular configurations, the diffusion depth can be effectively controlled by varying the intensity and time of heat application to the nanoparticle ink. Also, a highly vertical p-n junction can be formed using this approach.

For example, a nanoparticle ink (such as a p-type or n-type) may be applied to wafer bulk or substrate. The nanoparticle ink may be printed, spun, sprayed, etc., or deposited in any other suitable way, on the wafer surface in order to firm a non-densified thin film. This non-densified thin film may then be heated in a pre-bake step (at about 300° C. from about 1 minute to about 30 minutes) in order to remove solvents and capping agents. The non-densified thin film may then be heated (at between about 800° C. to about 1000° C. and for about 10 seconds to about 10 minutes) in order to sinter the nanoparticles into a densified film, as well as to diffuse dopants in the densified film to diffused into the underlying wafer, creating a diffused region. A heating step can be performed, e.g., in a rapid thermal processing (RTP) tool, batch furnace, belt furnace, using fast flash lamp system, or even a laser.

A junction may be formed in a wafer as a result of the dopant diffusion process, originating from the printed doped nanoparticle film. In particular configurations, dopants from a sintered nanoparticle layer are diffused into the wafer to form a diffusion region with the application of heat. In this fashion, a diffusion region is formed as a result of dopant diffusion, and the depth of region can be adjusted by changing the process temperature and/or process time. Higher process temperature and longer process time will result in a deeper diffusion region. For example, sintering at about 1000° C. for about 20 seconds can result in a diffusion depth of from about 5 nm to about 10 nm for boron or phosphorous dopant atoms. In general, sintering temperatures of between about 800° C. and about 1000° C. are adequate for dopant diffusion.

The use of a nanoparticle ink allows substantial flexibility in the manufacturing of the resulting device. For example, a set of counter doped diffused regions may be configured on a single wafer side in order to create, for example, a field effect transistor (FET) or a back contact solar cell. Counter doping generally refers to doping a first diffused region with a dopant (such as a p-type dopant) that is opposite to the dopant in the second diffused region (such as an n-type dopant).

A FET is generally a type of transistor that relies on an electric field to control the conductivity of a channel in a semiconductor material. The channel of a FET is generally doped to reproduce either an n-type semiconductor or a p-type semiconductor. The drain and source may be doped of opposite type to the channel. In addition, FETs of different type, such as N-MOSFET and P-MOSFET, may be further aggregated into larger doped regions on the substrate called P-wells and N-wells to simplify the device layout. That is, N-MOSFET transistors may be aggregated in P-wells, while P-MOSFET transistors may be aggregated in N-wells. Consequently, nanoparticle ink may be used to define patterns that can be annealed to form N-wells and P-wells. More details may be found in U.S. patent application Ser. No. 11/954,784, filed Dec. 12, 2007, the entirety of which is incorporated herein by reference.

A back contact solar cell is solar cell in which all the contacts on the back surface, simplifying solar cell module assembly, as well as potentially improving performance levels due to reduced and/or eliminated front-side grid obscuration.

Alternately, first set of doped diffused regions may be configured on a first side of a wafer, while a second counter doped set of doped diffused regions may be configured on the opposite wafer side, such as with a solar cell. See '887 patent application above.

In addition, a first deposited non-densified thin film prebake step may be performed concurrently with a second deposited non-densified thin film prebake step, or may be performed later on in the process. Likewise, a first non-densified thin film sintering step may be performed concurrently with a second non-densified thin film sintering step, or may be performed later on in the process. Additionally, the prebake temperature and pre-bake time period may be the same or may be different. Similarly, the sintering temperature and sintering time period may be the same or may be different.

For example, p-type dopants (e.g., boron) may be diffused into an n-type wafer. However, n-type dopants (e.g., phosphorous) may also be similarly diffused into a p-type wafer or substrate. The choice of an n-type or p-type wafer substrate is generally determined by optimizing for specific types of defects (e.g., impurity in the deposited ink film, junction space-charge region location, passivation, mobility of minority carriers, susceptibility to crystallographic defects creation, susceptibility to impurity contamination, availability of contacting schemes, etc).

In this fashion, a p-n junction can be formed away from the surface of the wafer to reduce recombination difficulties in the junction space-charge region. For example, a diffusion region can extend into a wafer from about 5 nm to about 100 nm. However, this diffusion region can extend to about 2 µm or deeper if the heat source is maintained for an appropriate duration and/or the process temperature is increased. In any event, a diffusion region boundary relatively close to the wafer surface or interface may result in performance degradation of a solar cell constructed therefrom due to recombination and variations in the depletion region shape. For these reasons, a diffusion region can be extended a controllable distance away from this interface.

Further, a diffused back-surface-field (BSF) of the same dopant type as the wafer may be prepared in the same manner as described above. A function of such a layer is to repel minority carriers located closer to the wafer back-side than a diffusion length to a p-n junction (e.g., located near the frontside) and to form an ohmic contact for collection of majority carriers. That is, the interface between a high-doped diffused BSF, and a low-doped wafer tends to introduce a barrier to minority carrier flow to the rear surface, resulting in higher levels of minority carrier concentrations in the wafer absorber. In this way, the BSF tends to passivate the rear wafer surface. For example, Al (aluminum) or B (boron) may be added to a p-type wafer to repel electrons. In contrast, for an n-type wafer, P (phosphorous) or As (arsenic) may be added to repel holes.

In making a BSF, the depth and surface quality (e.g., surface recombination) due to the associated dopant profile can also be controlled. Such a process (e.g., including a phosphorus dopant) may also getter impurities from the bulk of the wafer. For example, in order to form a BSF on a p-type wafer, a p-type ink layer (e.g., boron-doped) should be deposited on the wafer. For an n-type wafer, an n-type ink (e.g., doped with phosphorus) can be used for the BSF.

Further, ink films in particular configurations may be optimized to increase light trapping, and hence improve efficiency, by providing sub-micron scale optical roughness. Also, the wafer surface itself can be additionally textured on the micron scale to further optimize the light trapping.

In general, the heavily doped sintered layer may have to be removed from the wafer surface, e.g. to allow for a better passivation of the wafer surface, to provide a better electrical contact to the wafer, or to reduce parasitic light absorption in the remaining sintered layer. Approaches for removing remaining sintered nanoparticle layer material after the dopant has diffused into the wafer (e.g., to allow for passivation) include using various forms of silicon layer etching, such as a dry etch (e.g., using $CF_4/O_2$ plasma) or a wet etch (e.g., using diluted CP4 or alkali metals). However, due to variable properties of the sintered layers, such approaches may not be precisely repeatable, and may result in too much or too little etching.

In particular configurations, removal of the sintered nanoparticle layer and/or film can be facilitated by creating a thin spacer between the printed film and the wafer. During a diffusion step, dopants from the sintering nanoparticle layer can penetrate through this thin spacer (e.g., an oxide layer) and dope the underlying wafer, thus creating a relatively shallow junction with low absorption losses. The sintered nanoparticle layer and the underlying spacer layer can then be removed together. In this fashion, the film removal process can be substantially reproducible, and not dependent on particular properties (e.g., density, thickness, etc.) of the film itself.

FIGS. 1A-D show a simplified set of cross-section diagrams of an example process flow for doping a wafer through an optional oxide layer, in accordance with the present invention. Referring now to FIG. 1A (500A), a wafer (e.g., silicon) 502 can have a relatively thin layer of oxide 504 optionally formed thereon. For example, a silicon wafer can have a $SiO_2$ layer of a thickness of from about 0.5 nm to about 5 nm grown or deposited on wafer 502. Other examples of thin spacer materials include silicon nitride, or any suitable material that can withstand high temperatures required for diffusion, is substantially transparent for dopant diffusion, and is susceptible to selective removal from silicon after the diffusion process.

Figure 1B:
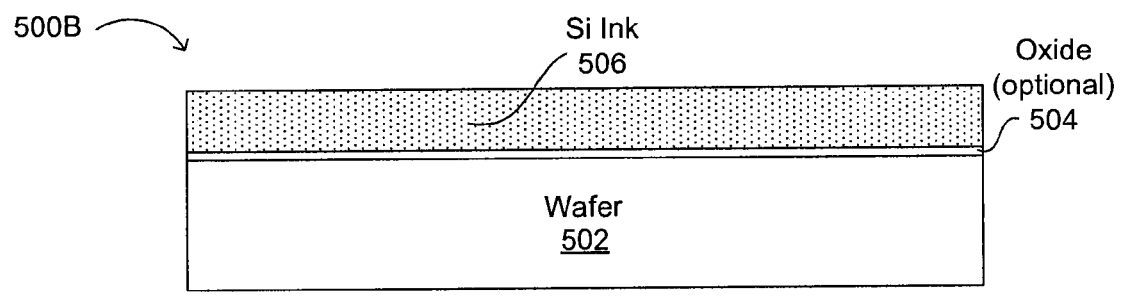
Figure 1C:
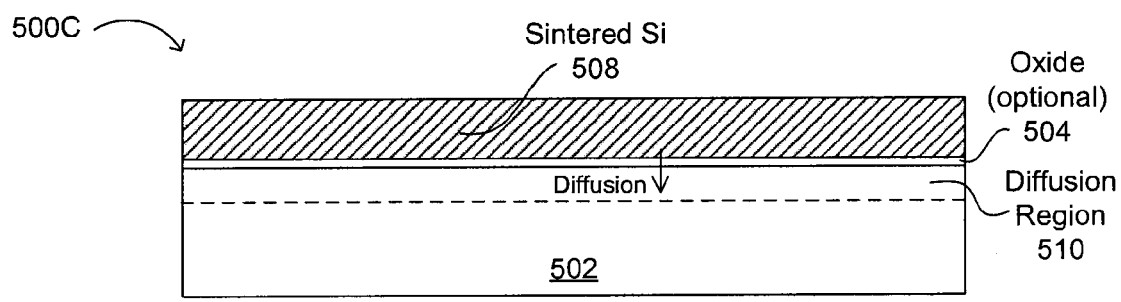

Referring now to FIG. 1B (500B), a nanoparticle ink (e.g., a silicon ink) 506, as described above, can be printed or otherwise deposited on optional oxide layer 504. If oxide layer 504 is not present, nanoparticle ink 506 may be deposited directly on the surface of wafer 502. The nanoparticle ink may be heavily doped n-type for p-type wafer 502, or heavily doped p-type for n-type wafer 502 to form an emitter. To form a BSF, the nanoparticle ink may be heavily doped n-type for n-type wafer 502, or heavily doped p-type for p-type wafer 502. Once the ink is deposited on the wafer, heat can then be applied in order to sinter the nanoparticle ink and diffuse dopants into the wafer. As shown in FIG. 1C (500C), sintered nanoparticle ink layer (e.g., silicon ink) 508 on optional thin oxide layer 504 can result in dopant diffusion into wafer 502. In this fashion, diffusion region 510 can be formed.

Figure 1D:
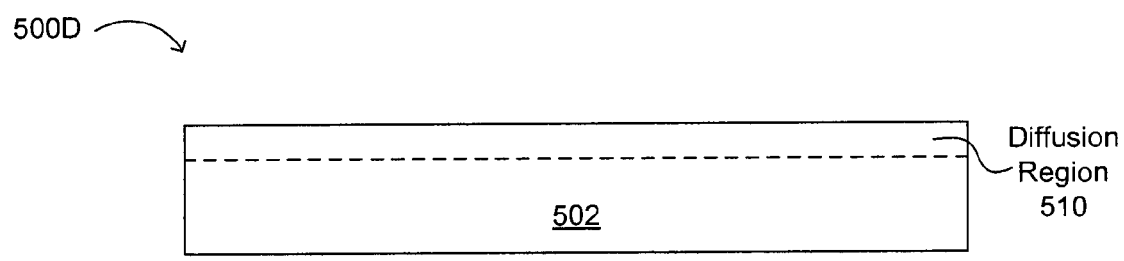

Referring now to FIG. 1D (500D), remaining sintered nanoparticle material (e.g., 508), and oxide layer 504 if present, can be removed from the wafer surface. For example, this material can be removed by an HF dip or etchant to remove supporting oxide layer 504, thus lifting off sintered nanoparticle layer 508. In the absence of the optional layer 504, the sintered Si film 508 can be removed by appropriate silicon etching methods, such as dry etch or wet etch methods. Once this material has been removed, a passivation or other protective coating (e.g., indium tin oxide (ITO), silicon nitride etc.) followed by a metallization scheme to form contacts can be applied to the structure to form a solar cell. Further, while the wafer surface after removal of material 508 is shown to be smooth, this surface can also be jagged or otherwise textured in certain configurations.

Figure 2:
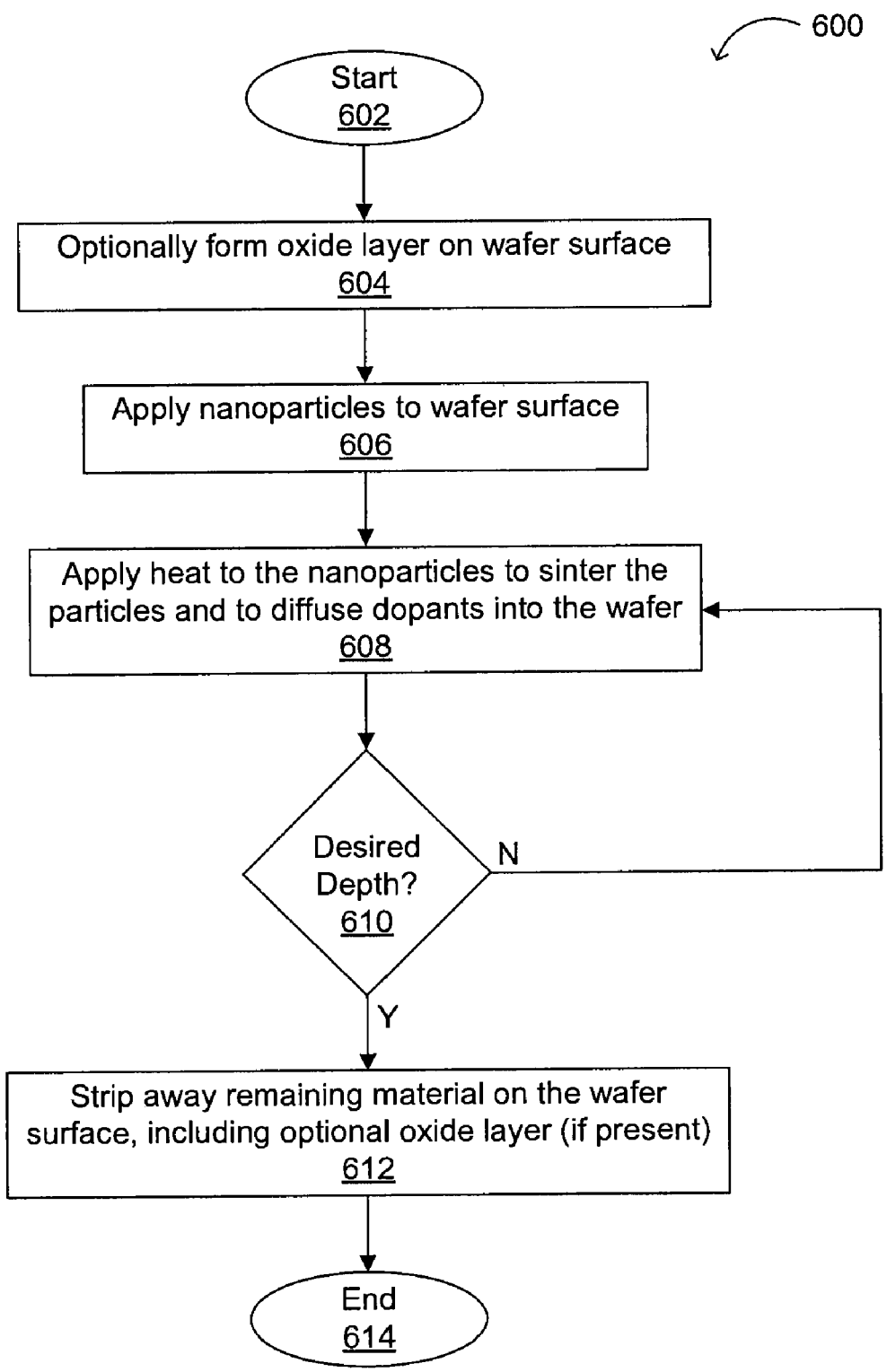
FIG. 2 shows a simplified flow diagram of an example method of creating a junction, in accordance of the present invention.

Referring now to FIG. 2, a simplified flow diagram is shown of an example method 600 of creating a junction, in accordance with the present invention. The flow begins 602 by optionally forming an oxide layer on a wafer surface (604), followed by applying nanoparticle ink (e.g., 506) to a wafer surface (606). Heat may then be applied to the nanoparticles in order to sinter the particles and diffuse the dopant into the wafer (608). Heat may continually and/or periodically be applied (608) until a desired depth has been reached for the diffusion region (e.g., region 510) into the wafer (610). For example, such a depth may be experimentally determined by applying an appropriate heat profile for the particular heat source and underlying wafer material used.

Once the appropriate diffusion depth has been reached (610), remaining material on the wafer surface, including a thin oxide layer if present, can optionally be stripped away (612), thus completing the flow 614. For example, a timed etch (e.g., using $HF/HNO_3/CH_3COOH$, the $CP_4$ etch, etc.), or dry etch, such as $CF_4/O_2$ or $NF_3$ plasma, can be used to remove some or all remaining particles on the wafer surface. Generally, the wafer surface may be textured prior to such material removal, yet a partial removal of the material may also result in texturing. In another approach, a dry etch can be used to increase the surface roughness, or any other suitable approach can be employed to create a textured or pyramidal surface structure for more efficient light trapping in a solar cell application. In this case care should be taken to establish a uniform doped region without exposing undoped base wafer regions, which could result in subsequent junction shunting

EXAMPLE 1

In this example, 1"×1"×0.019" silicon wafer substrates doped with phosphorus to a resistivity of about 1 to 5 Ohm× cm are cleaned by treatment with NaOH, SC2, Buffered Oxide Etch (BOE), and Piranha, respectively.

In addition, a p-type silicon nanoparticle ink was prepared in an inert environment from the silicon nanoparticles of about 10.0 nm+/−0.5 nm as a 5 mg/ml solution of pyridine, which was sonicated using a sonication horn at 15% power for 15 minutes. Applying sufficient silicon nanoparticle ink to substantially cover the wafer surface, a silicon nanoparticle porous compact was formed using spin casting, at 1000 rpm for 60 seconds. After baking this layer in an inert environment on a hotplate at 100 C for 30 minutes, a second silicon nanoparticle porous compact was formed using spin casting, at 1000 rpm for 60 seconds, followed by baking in an inert environment on a hotplate at 100 C for 30 minutes. The resulting thickness of the silicon nanoparticle porous compact layer was about 70 nm.

After the deposition and preconditioning steps were complete, the nanoparticle porous compact was processed at 1000° C. for 20 seconds (sample 1) and 300 seconds (sample 2) in a rapid-thermal-processing tool to sinter the n+ particles and to diffuse dopants into the wafer. Subsequently, a 100 nm capping layer of aluminum was thermally evaporated on top of the sintered layer.

Figure 3:
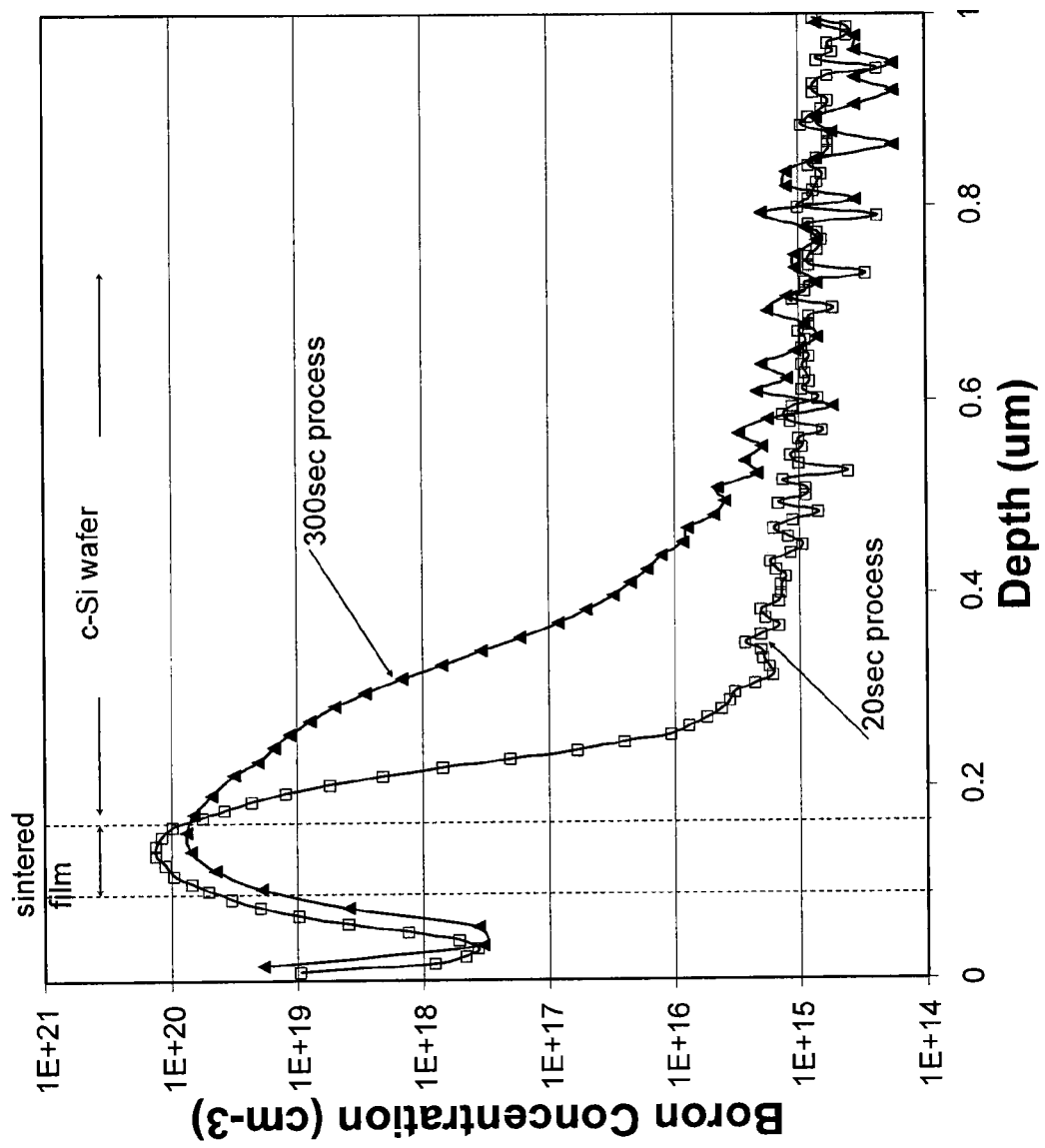
FIG. 3 shows a simplified figure with secondary ion mass spectroscopy results for boron diffusion from a heavily p-type doped sintered layer into the c-Si wafer, in accordance with the present invention.

Referring now to FIG. 3, the simplified results are shown of the Secondary Ion Mass Spectroscopy measurements of the Boron diffusion from the sintered nanoparticle layer into the wafer for these samples, in accordance with the invention. Boron concentration peaks around $10^{20}$ cm$^{-3}$ for both samples around the depth values that correspond to the location of the heavily p-type doped sintered film, as expected. However the boron profile after 300 sec long process extends significantly deeper into the wafer, compared to the sample that was processed for 20 sec only. This is generally an indication that the tail of the boron profile in the wafer corresponds to the diffusion of boron atoms from the doped film into the wafer, the process that can be controlled, e.g. by duration of the thermal process.

In addition, junction creation in particular configurations can be used in a CMOS-like process where remaining material after creating the diffusion region is removed.

Integrated Circuit Doped Semiconductor Region Formation

In CMOS processes, wells (e.g., n-wells and p-wells) are typically formed using process flows including masking, dopant implantation into exposed photoresist regions, annealing to drive the dopants into the wafer, and photoresist removal. Transistors (e.g., NMOS and PMOS) and other semiconductor devices can be fabricated within the appropriate well regions.

In particular configurations, printing of doped nanoparticle inks onto a silicon wafer, followed by an annealing step, can produce similarly doped regions suitable for subsequent semiconductor processing. For example, an ink of p-type particles is printed in a predetermined pattern on a wafer followed by an annealing step. As a result, the single crystalline region from the wafer below can propagate up into the particle region in an epitaxial growth process to form a p-type doped single crystalline region. The same or a similar process may then be repeated for n-type particles to form n-type single crystalline regions. Once these n-type and p-type single crystalline regions are formed, transistors (e.g., NMOS and PMOS devices), or other semiconductor devices, can be built in those areas.

Figure 4A:
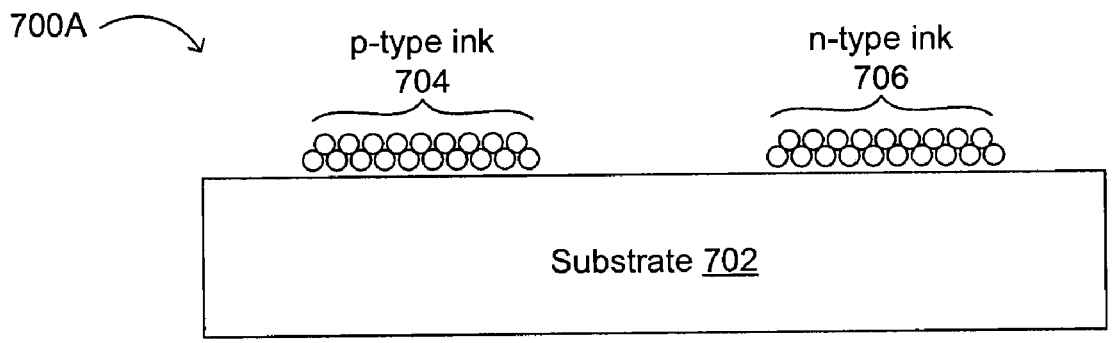
FIGS. 4A-B show a simplified set of cross-section diagrams of an example process flow for forming doped regions, in accordance with the present invention.
Figure 4B:
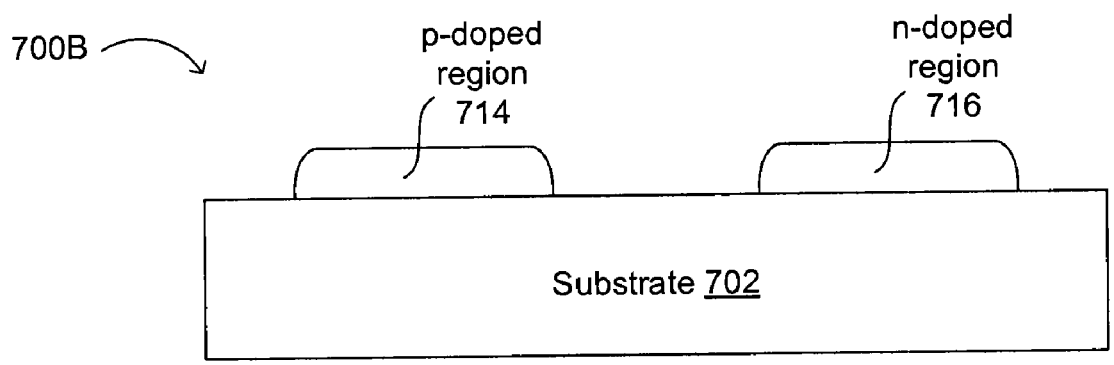

Referring now to FIGS. 4A-B, a simplified set of cross-section diagrams are shown of an example process flow for forming doped regions, in accordance with the present invention. As shown in FIG. 4A (700A), doped particle inks may be printed with a pattern to generate doped films on a wafer substrate 702. For example, p-type ink 704 is printed in one pattern, and n-type ink 706 is printed in another pattern.

An annealing step can then be used to epitaxially regrow the doped regions on top of substrate 702, as shown in FIG. 4B (700B). For example, p-doped region 714 can be regrown in a region corresponding to printed p-type ink 704, and n-doped region 716 can be regrown in a region corresponding to printed n-type ink 706. In this fashion, conventional lithography and implant steps for well formation can be eliminated, thus decreasing overall process costs. For example, the heights of p-doped region 714 and n-doped region 716 can each be in a range of from about 20 nm to about 5 um, and including from about 20 nm to about 1 um.

Figure 5:
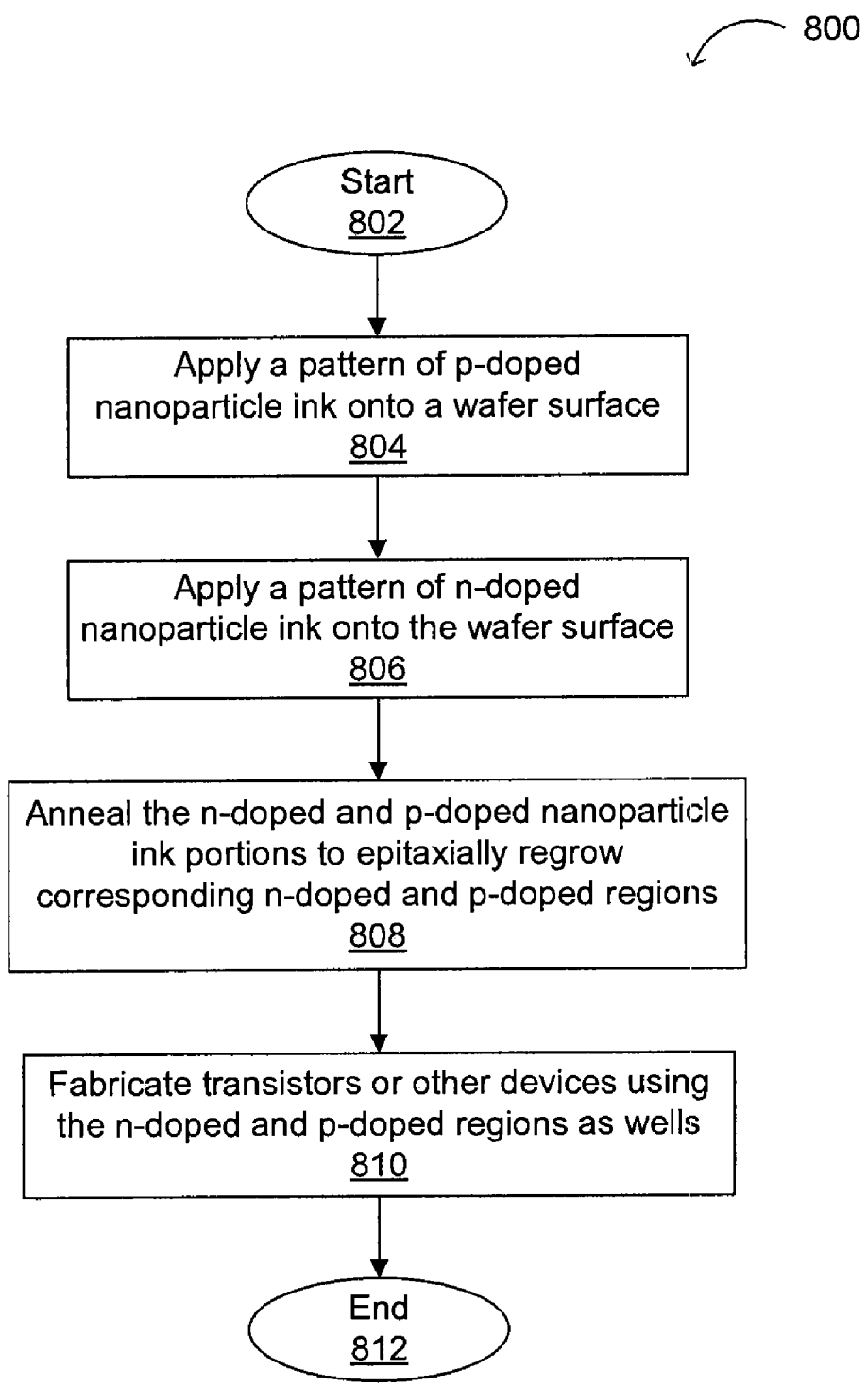
FIG. 5 shows a simplified flow diagram of an example method of forming doped regions in accordance with the present invention.

Referring now to FIG. 5, a simplified flow diagram is shown of an example method 800 of forming doped regions, in accordance with the present invention. The flow begins 802, and a pattern of p-doped nanoparticle ink can be applied to a wafer surface (804). Similarly, a pattern of n-doped nanoparticle ink can be applied on the wafer surface (806). The n-doped and p-doped nanoparticle ink portions may be annealed to epitaxially regrow corresponding n-doped and p-doped regions (808). Alternatively, annealing for the n-doped region can occur independently of the annealing for the p-doped region in subsequent steps. Transistors or other devices can then be fabricated using the n-doped and p-doped regions as wells (810), completing the flow 812.

For the purposes of this disclosure and unless otherwise specified, "a" or "an" means "one or more." All patents, applications, references and publications cited herein are incorporated by reference in their entirety to the same extent as if they were individually incorporated by reference.

The invention has been described with reference to various specific and illustrative embodiments. However, it should be understood that many variations and modifications may be made while remaining within the spirit and scope of the invention. Advantages of the invention include the production of low cost and efficient junctions for electrical devices, such as solar cells.

Having disclosed exemplary embodiments and the best mode, modifications and variations may be made to the disclosed embodiments while remaining within the subject and spirit of the invention as defined by the following claims.

What is claimed is:

1. A method of forming a diffusion region, comprising:
   coating the surface of a wafer with a spacer layer, before the depositing of the nanoparticle ink;
   depositing a nanoparticle ink on a surface of the wafer to form a non-densified film, the nanoparticle ink having set of nanoparticles, wherein at least some nanoparticles of the set of nanoparticles include dopant atoms therein;
   heating the non-densified film to a first temperature and for a first time period to remove a solvent from the deposited nanoparticle ink;
   heating the non-densified film to a second temperature and for a second time period to form a densified film, wherein at least some of the dopant atoms diffuse into the wafer to form the diffusion region; and, removing the densified film and the spacer layer, after heating the non-densified thin film to a second temperature and for a second time period.

2. The method of claim 1, wherein the step of removing the densified film and the spacer layer includes using one of an HF dip or a buffered oxide dip.

3. The method of claim 1, wherein the spacer layer comprises oxide.

* * * * *